United States Patent [19]
Soto

[11] Patent Number: 5,153,981
[45] Date of Patent: Oct. 13, 1992

[54] UNIVERSAL APPARATUS FOR FORMING LEAD WIRES

[75] Inventor: Vicente Soto, Riverside, Calif.

[73] Assignee: Hughes Aircraft Company, Los Angeles, Calif.

[21] Appl. No.: 718,139

[22] Filed: Jun. 20, 1991

[51] Int. Cl.$^5$ .................. B23P 19/00; H05K 13/04
[52] U.S. Cl. ........................... 29/701; 29/741; 29/840
[58] Field of Search ............. 29/739, 741, 832, 835, 29/837, 839, 840, 844, 720, 701–704

[56] References Cited
U.S. PATENT DOCUMENTS

| | | | |
|---|---|---|---|
| 4,622,740 | 11/1986 | Mirley, Jr. | 29/741 X |
| 4,726,114 | 2/1988 | Staviski | 29/739 X |
| 4,908,931 | 3/1990 | Itoh et al. | 29/741 X |

Primary Examiner—Timothy V. Eley
Attorney, Agent, or Firm—Terje Gudmestad; W. K. Denson-Low

[57] ABSTRACT

Lead wires (4) extending out from an electrical circuit device (2) are shaped for engagement to a substrate (38,40) upon which the device (2) is placed by engaging the lead wires (4) at a location laterally spaced from the device (2), exerting a force on the lead wire (4) at the engagement location to bend it down to the substrate (38,40), and then applying an inward force on the bent lead wire (4) towards the device (2) to further bend the wire to the desired shape. The lead wire (4) is engaged by a forming tool (21,27,33) having a universal head that applies the inward force either by biting into the lead wire (4) with a sharp edge (26), or by moving a bearing wall (36) against the end of the wire (4). When the forming tool (21,27,33) is operated by a programmable wire bonding system, the wire forming operation can be integrated with the bonding operation by using the same forming tool (21,27,33) to perform both functions. A single tool can be used to accommodate many different types of circuit packages and lead wire configurations.

13 Claims, 4 Drawing Sheets

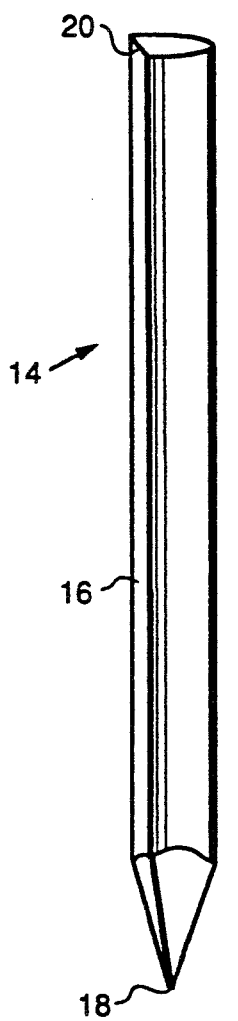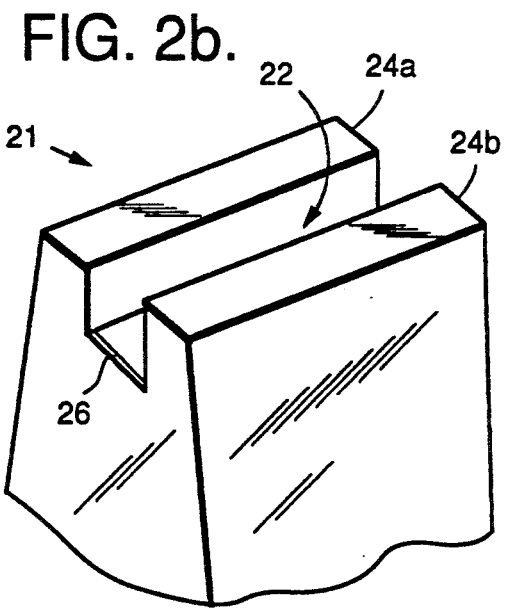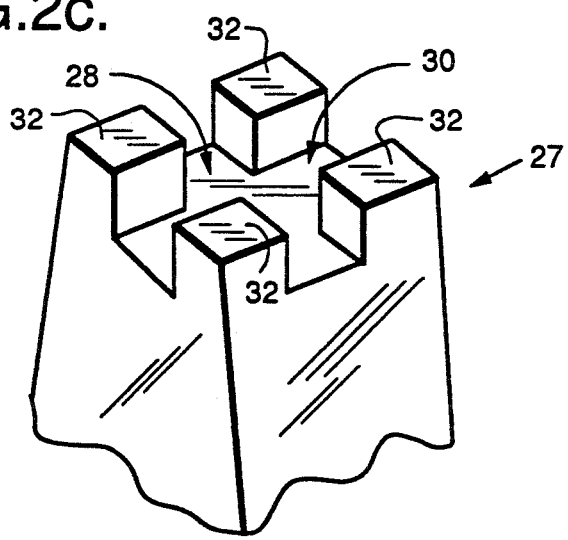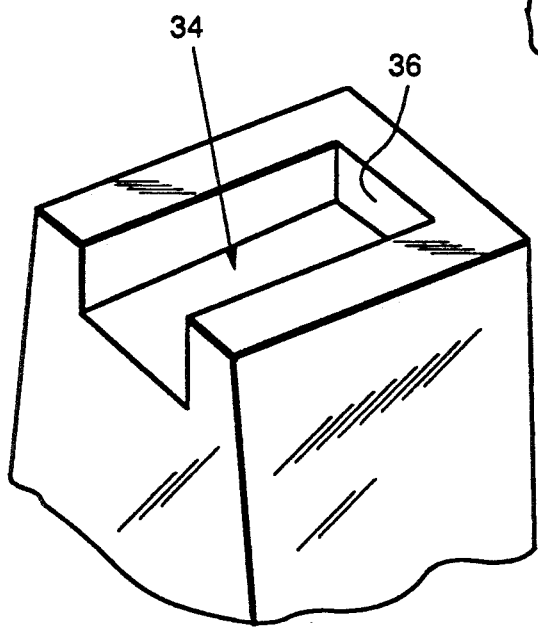

UNIVERSAL APPARATUS FOR FORMING LEAD WIRES

BACKGROUND OF THE INVENTION

1. Field of the Invention

This invention relates to the mechanical bending of lead wires extending from electrical circuit packages to a desired shape for bonding onto a substrate.

2. Description of the Related Art

TAB (tape automated bonding) integrated circuit (IC) chips are generally formed with straight lead wires extending laterally out from the chip. To mount and electrically connect the chip to a circuit board or other substrate, the lead wires must be bent down so that they can make contact with bonding pads on the substrate. The ends of the lead wires that contact the bonding pads must be kept straight and parallel to the pads. For this purpose special lead wire forming tools have been used.

A typical lead wire forming operation is shown in FIG. 1. A TABed IC chip 2 has a set of lead wires 4 which initially extend laterally outward from the upper surface of the chip and are clipped to the desired length. The chip 2 is then placed on a special forming substrate 6 from which fulcrum bars 8 extend upward adjacent to the edges of the chip to support the undersides of the lead wires 4.

To conform the ends of the lead wires 4 to the substrate 6, a mechanical forming tool 10 is used. The forming tool includes a set of stamping bars 12 that extend down from the tool in alignment with the outer sections of lead wires 4. The tool 10 is lowered against the lead wires so that the stamping bars 12 force the ends of the lead wires down flat against the substrate, with the lead wires bending about the fulcrum bars 8 and again about the inner edges of the stamping bars 12. The lead wires are now properly formed so that their outer ends can be bonded to bonding pads on their mounting substrate.

While the lead wires for a particular part design can be formed in a fairly efficient manner with this type of die tool, different sets of tooling are required for each different chip and wire size. Each different set of tooling can be quite expensive, and can require a substantial lead time for delivery Also, a dedicated forming substrate with fulcrum bars 8 is necessary for each chip size.

SUMMARY OF THE INVENTION

The present invention seeks to provide a method and apparatus for forming the lead wires of many different IC devices with a single universal forming tool that is inexpensive and does not require substantial time to change from one chip device to another. The invention also seeks to integrate the lead wire forming process with an automated bonding process that bonds the ends of the wires to their contact pads once they have been formed to the proper shape.

These goals are achieved with a universal forming head that first bends the outer end of a lead wire down, and then bends it inward towards the chip until it attains a desired shape with its lower surface in full contact with an underlying bonding pad. The forming head engages the lead wire for inward movement by means of either a sharp edge or by an abutment wall on the head, so that the lead wire slides over the substrate to the desired position.

The forming head is moved from wire to wire on the device, applying the proper shape to each wire in turn. When the chip includes lead wires which extend out from mutually perpendicular edges, the forming system accommodates the change in wire orientation by either rotating the head as it traverses a corner of the device, or by providing a head with orthogonal symmetry.

The new wire forming technique can be integrated in with an automated wire bonding system. The lead wire geometry is captured and used to generate a series of forming head movements, which are programmed into memory in the automated wire bonder. The memory then repeats a series of preset forming head movements for each successive chip. When a new chip is introduced, the memory is simply re-programmed with the proper forming head movements that correspond to the new chip. The same forming head can thus be used for a multitude of different lead wire configurations. The same forming tool can be used to both shape the lead wires and bond them to respective bonding pads.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 2a, 2b, 2c and 2d are perspective views respectively of a tool used in the new wire forming process, and of three different forming head configurations that may be employed at the tip of the tool;

DETAILED DESCRIPTION OF THE INVENTION

Figure 1:
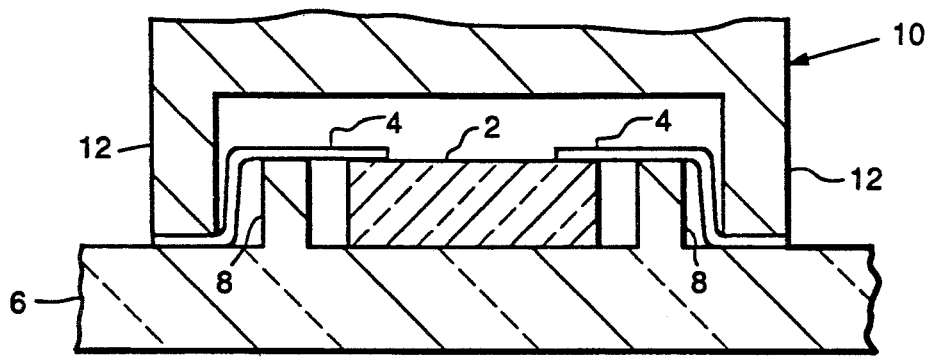
FIG. 1 is a sectional view of a prior lead wire forming technique, described above.

A tool 14 that can be used to form the lead wires of an electrical circuit package into the proper shape for mounting on a circuit board or other substrate in accordance with the invention is shown in FIG. 2a. It consists of a shank 16 that can be inserted into an automated wire bonding system, with the lower end of the shank tapered and terminating at a forming head 18. The shank 16 is circular in cross-section, except for a chord 20 that is cut out so that the shaft may be held and properly oriented in the wire bonding system. Various types of programmable wire bonders, such as the Hughes Aircraft Company Autobonder HMC 2460 or 2470, may be used.

The forming tool can be made from titanium carbide, tool-grade steel or other hard machinable material. The head 18 can be formed in various ways, depending upon the intended method of using the tool. FIG. 2b shows a head 21 that consists of a single channel 22 formed between a pair of parallel, spaced stamping bars 24a,24b. The channel 22 is preferably about 1.1 to 1.3 times the lead width, which is wide enough to accommodate most lead wires. In the preferred embodiment the head has a square outline about twice the lead width per side. The edges 26 at each end of the channel should be quite sharp, since as explained below one or the other of these edges are intended to "bite" into a lead wire as it is being formed.

Another head configuration 27 is shown in FIG. 2c. It is similar to the head in FIG. 2b, but it includes a pair of cross-channels 28 and 30 rather than the single channel 22 of FIG. 2b. The cross-channels 28 and 30 leave four corner-posts 32 extending from the corners of the head. The head configuration can be formed by a conventional electron discharge machining operation. The cross-channels allow the head to be used to form the lead wires which extend from mutually orthogonal edges of an IC package without having to rotate the head, as explained further below.

A third head embodiment 33 is illustrated in FIG. 2d. In this variation a single central channel 34 extends only partially across the head, and terminates in a bearing wall 36. The depth and width of channel 34 are equal to that of channels 22, 28 and 30 in FIGS. 2b and 2c. The bearing wall 36 is provided to engage the end of the lead wire to bend it inward, rather than gripping the upper surface of the lead wire with the edge of a channel as in FIGS. 2b and 2c.

The process of forming a lead wire to a desired shape with the invention is illustrated in FIGS. 3a-3d. A cross-channel tool head 27 of the type shown in FIG. 2c is illustrated, but a similar processing sequence would be used with the other heads also.

The TABed IC chip 2 is positioned at its desired location on a substrate 38; a recess will generally be provided in the substrate for this purpose. This allows the lead wires 4 to be formed to the proper shape, and bonded to respective bonding pads 40 which form part of the substrate in a single operation. Alternately, the lead wires could be shaped on a separate forming stage, and the chip then placed on the final substrate 38 for bonding the shaped lead wires to the bonding pads.

Figure 3A:
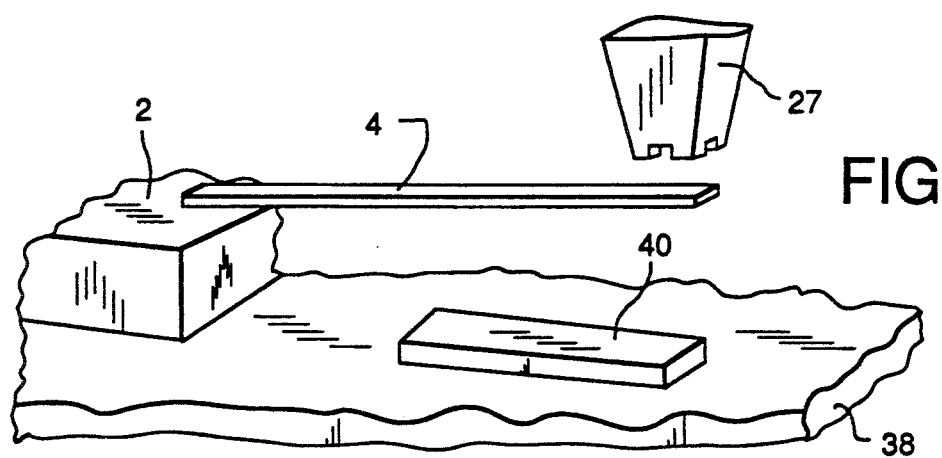
FIGS. 3a-3d are perspective views showing successive steps in the shaping of lead wires according to the invention.
Figure 3B:
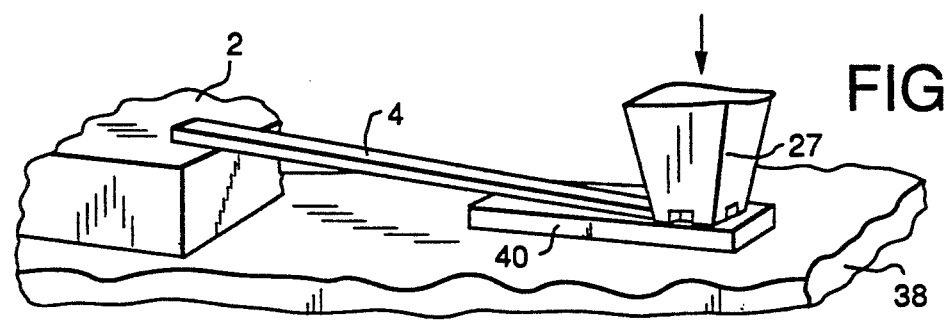

The upper portion of forming tool 27 is configured in the same manner as a standard bonding probe so that it can be easily inserted into an automated wire bonding machine, with the substrate 38 held in place on the machine in a conventional manner. As shown in FIG. 3b, the forming tool 27 is moved vertically downward against the outer portion of the first lead wire 4 under the wire bonder control, so that the lead wire fits within one of the cross-channels between the cornerposts on the tool head. The lead wire is bent down by the tool movement in a cantilever fashion until it contacts the outer portion of the underlying contact pad 40.

Figure 3C:
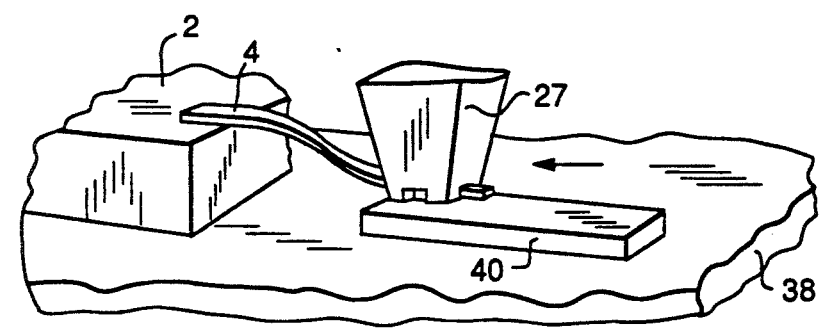

The tool movement is programmed in the wire bonder so that the tool head presses the lead wire 4 firmly against the contact pad. The tool is next translated horizontally inward towards the chip 20, parallel to the upper surface of bonding pad 40. The vertical downward force of the tool against the lead wire is programmable within the wire bonder system, generally within the range of 40-150 grams. The firm engagement between the tool head and the lead wire, which is typically gold-plated copper, causes the leading edge of the channel in which the lead wire is situated to bite slightly into the upper lead wire surface, causing the lead wire to slide inwardly over the bonding pad along with the tool head 27. This movement forces the lead wire into a compound bend, as illustrated in FIG. 3c. The inward motion of the tool head is continued until the desired lead wire shape is reached, at which point the outer end of the lead wire is flat against the inward portion of the bonding pad 40 and forms an area contact therewith.

A conventional bonding process can now be entered to bond the lead wire to the underlying pad, without having to move or rearrange any of the parts. The bonding is preferably accomplished with a conventional thermosonic technique by heating the substrate, and vibrating the tool head at an ultrasonic frequency. Thus, a single tool 27 serves the dual purpose of both forming the lead wire to the proper shape, and bonding it to the bonding pad.

Figure 3D:
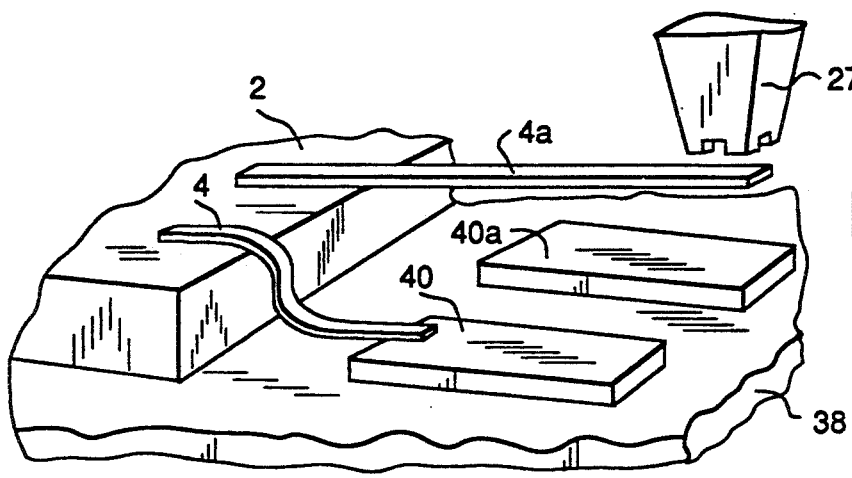

When the bond has been completed, the tool 27 is lifted up and away from the lead wire 4 as part of the programmed wire bonder movement, and shifted laterally into vertical alignment over the outer section of the next adjacent lead wire 4a, at which point the process is repeated to properly shape lead wire 4a and bond it to the underlying pad 40a (FIG. 3d). The process is repeated until each of the lead wires extending from the chip have been shaped and bonded to their respective bonding pads.

Figure 4A:
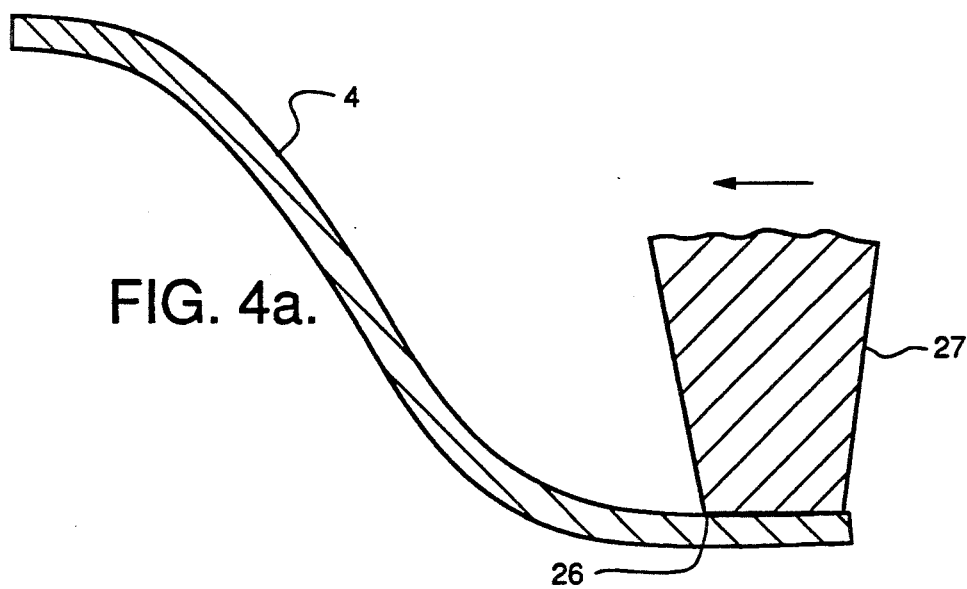
FIGS. 4a and 4b are sectional views showing two different forming head embodiments engaged with a lead wire.
Figure 4B:
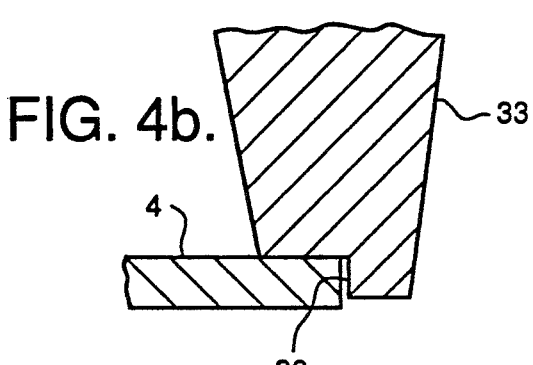

The manner in which the various tool heads shown in FIGS. 2b-2d engage a lead wire 4 for inward bending movement towards the IC chip is illustrated in FIGS. 4a and 4b. In FIG. 4a a tool head 27 of the type shown in FIG. 2c is moving to the left, causing the lead wire 4 to bend inward. The sharp leading edge 26 on the tool head bites into the upper surface of the lead wire 4 under the downward and inward pressure exerted by the tool head. In FIG. 4b, by contrast, the tool head 33 is of the type illustrated in FIG. 2d. As the tool head moves to the left, its bearing wall 36 engages the end of the lead wire to force it inward.

Figure 5:
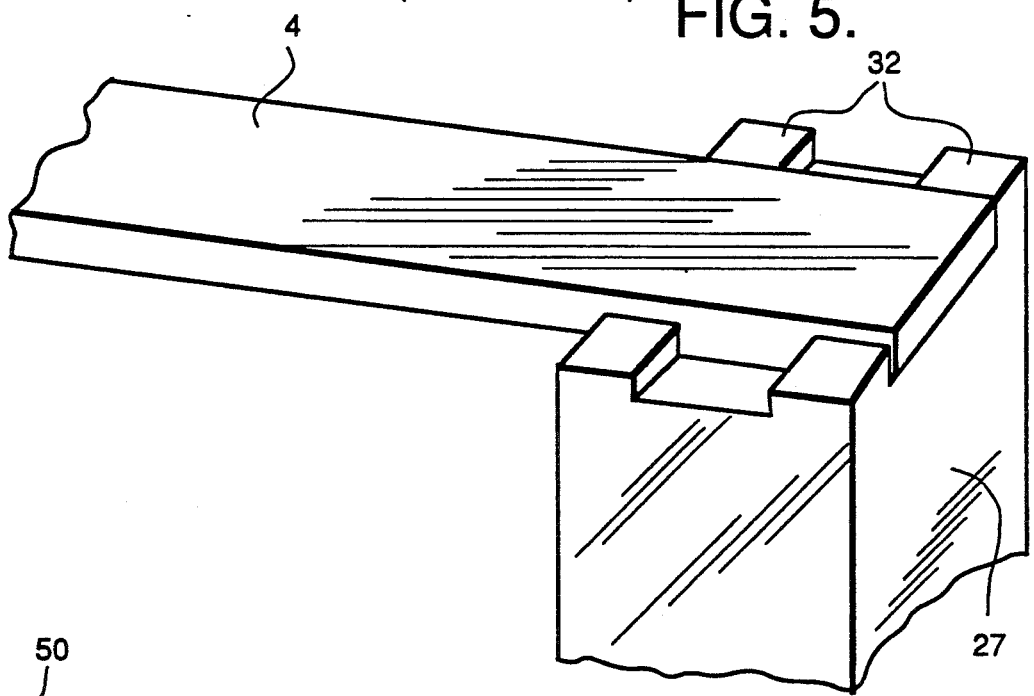
FIG. 5 is a perspective view showing the relative dimensions of a forming head engaged with a lead wire.

To prevent damage to the underlying bonding pad, the channel established in each of the different tool heads is preferably slightly shallower than the thickness of the lead wire. This situation is illustrated in FIG. 5, in which the lead wire is captured in a tool head 27 of the cross-channel type illustrated in FIG. 2c. The corner-posts 32 extend upward about ⅔ of the lead thickness from the base of the tool head, or slightly less than the typical lead wire thickness.

Figure 6:
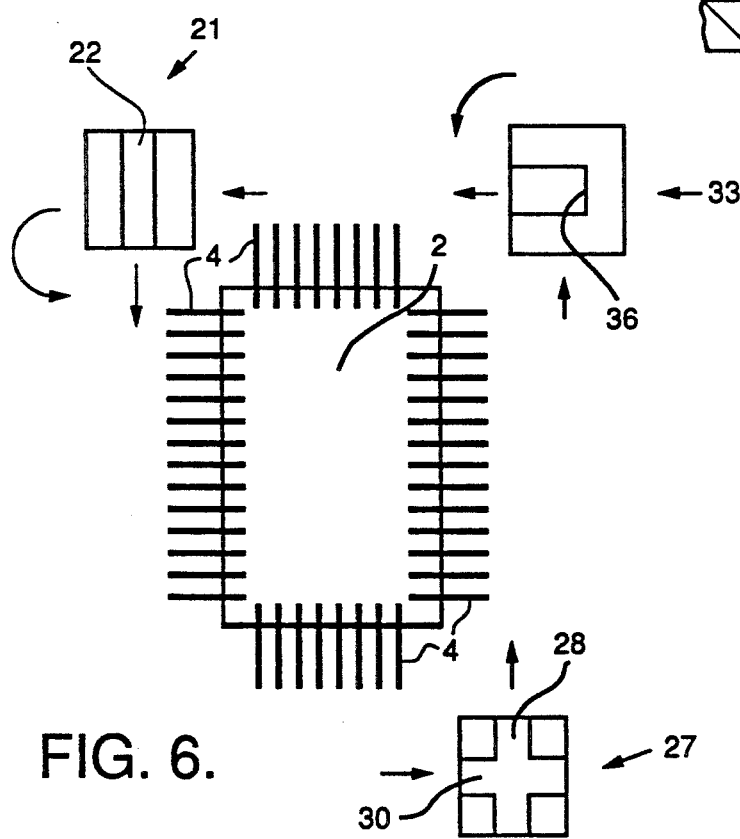
FIG. 6 is a diagram illustrating the movement of various forming head configurations with respect to an electrical circuit package.

Some automated wire bonding machines have a capability for rotating the bonding probe, while others do not. The manner in which the tool heads of the present invention can accommodate either system is illustrated in FIG. 6. A rectangular IC package 2 is shown with a set of lead wires 4 extending out from each of its edges. The lead wires 4 are first cut to the proper size, either by the use of a chisel tool or a laser cut on the wire bonder machine, or with a separate cutting tool of conventional design. If the wire bonder is not capable of rotating the tool head, or it is not desired to use this capability, the cross-channel tool head 27 can be used. It is illustrated in the figure as moving from the lower to the right hand set of lead wires. It first moves to the right until aligned with the ends of the right hand lead wires, and then up until it is centered over the first right hand lead wire By using channel 28 to engage the lower set of lead wires and channel 30 to engage the right hand set, the tool head can be moved from one set of lead wires to another in an x-y pattern without rotation.

A single channel tool head 21 is illustrated as moving from the upper to the left hand set of lead wires. It is angularly oriented for its engagement with the upper set of lead wires just completed, with the channel 22 parallel to the upper lead wires. During transit to the left hand set of lead wires it is rotated either clockwise or counterclockwise 90°, so that the channel 22 aligns with the new set of lead wires Similarly, the tool head 33 rotates 90° in turning a corner between successive sets of lead wires, so that the bearing wall 36 is orthogonal to the lead wire being formed at any given time.

Figure 7:
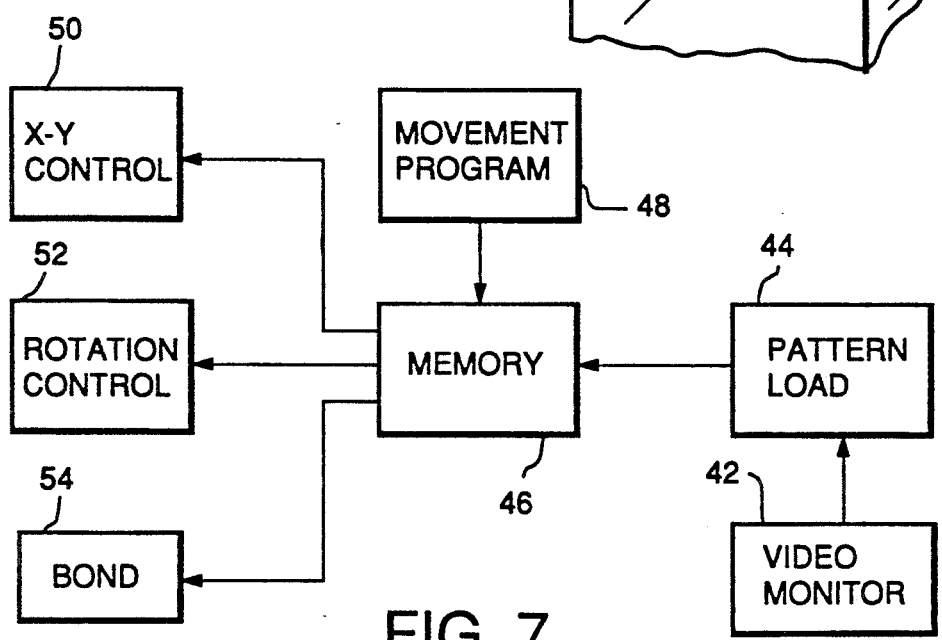
FIG. 7 is a block diagram of the new forming system integrated with an automated wire bonding system.

The relevant elements of a wire bonding machine used to implement the invention are shown in block diagram form in FIG. 7. When the TABed IC chip is initially positioned in the wire bonder, a video monitor 42 ascertains the chip and lead wire dimensions and geometries, and supplies them via a pattern load 44 to a control memory 46. With current wire bonder capabilities, the geometric patterns at different locations of the chip can be fed into memory initially and then recognized during production to align the wire forming tool with the chip. The memory 46 is also loaded with a user-supplied movement program 48 which establishes a pattern of tool head movements to form and bond the lead wires for each chip. These movements are repeated for successive chips of the same type. To switch to a different chip with a different lead wire configuration, the memory is re-programmed with another movement sequence designed for the new chip. Thus, different types of chips can be switched in and out by simply re-programming the wire bonder Since the programs for the different chips can be provided in a permanent storage medium, changing from one chip to another can be accomplished very quickly by simply selecting the appropriate stored program. It currently requires approximately four hours to write a forming tool movement program for a given chip, but this is a one-time requirement for any particular chip.

The memory 46 governs an x-y control 50 in the wire bonder that controls relative movement between the forming tool and the chip. Although the forming tool is typically moved while the chip is held statonary, this process could be reversed and the stage which holds the chip moved relative to a stationary forming tool; the important factor is the net relative movement between the forming tool and the lead wires which extend from the chip.

The memory 46 also governs a rotation control mechanism 52 for those applications in which there is a relative rotation between the forming tool and the chip in going around a corner from the end of one set of lead wires to the beginning of another set. As each lead wire in turn is formed to the proper shape, the control program stored in memory 46 causes the wire bonding apparatus to bond the lead wire to its underlying contact pad via the forming tool in an automated bond operation 54, as described above.

A single universal forming tool can thus be used for any number of different IC chips, with a large savings in tooling costs and a substantial improvement in efficiency. The chip leads can be formed and bonded in situ directly on their final mount, without the need for a dedicated forming substrate. Since axial tensioning of the lead wires is reduced during the forming operation relative to the prior technique, the change of unintentionally dislodging a lead wire is also reduced.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A system for forming a plurality of lead wires that extend laterally from an electrical circuit device for connection to a substrate upon which the device is placed, comprising:
    means for positioning the electrical circuit device with respect to the substrate,
    a forming head for engaging said lead wires,
    means for moving said forming head relative to the device, and
    controller means for controlling the relative movement of said forming head in a two-part movement with respect to said lead wires, with the forming head engaging a lead wire at a location spaced from the electrical circuit device and bending the lead wire down to said substrate during the first part of the movement, and bending the lead wire inward toward said electrical circuit device during the second part of said movement.

2. The system of claim 1, said forming head moving inward toward said electrical circuit device during the second part of said movement and having a sharp edge which engages the upper surface of said lead wires during said inward movement to prevent the forming head from slipping over said lead wires.

3. The system of claim 2, said lead wires comprising sets of lead wires that extend from said electrical circuit device in mutually orthogonal directions, said forming head including mutually orthogonal sharp edges, said controller means controlling the relative movement of said forming head so that it engages and bends said lead wires in succession and is moved relative to said device among said lead wires without rotating, with said sharp edges engaging the upper surfaces of respective sets of lead wires during inward movement of said forming head in engagement with said lead wires.

4. The system of claim 1, said forming head including a bearing wall, said controller means controlling the relative movement of said forming head to move inward toward said electrical circuit device during the second part of said movement with said bearing wall bearing against the end of a lead wire.

5. The system of claim 4, said lead wires comprising sets of lead wires that extend from said electrical circuit device in mutually orthogonal directions, wherein said controller means controls the forming head to engage said lead wires in succession and to rotate between said sets of lead wires so that said bearing wall faces said electrical circuit device during said inward movement.

6. The system of claim 1, said substrate including respective bonding pads aligned with said lead wires when said electrical circuit device is positioned with respect to said substrate, said controller means controlling the forming head to bend said lead wires so that they contact their respective bonding pads, and further comprising means for actuating said forming head to bond said lead wires to the bonding pads which they contact.

7. The system of claim 1, said controller means including a programmable memory for storing a sequence of relative forming head movements used to form the lead wires for a predetermined type of electrical circuit device, and means for repeatedly controlling said forming head moving means to execute said sequence of movements, thereby enabling the forming of leads for a plurality of electrical circuit devices of said predetermined type from a single stored sequence.

8. The system of claim 7, said programmable memory having a reprogram capability so that the stored sequence of relative forming head movements can be altered to form the lead wires for a different type of electrical circuit device.

9. A lead wire forming device for engaging a lead wire that extends laterally from an electrical circuit device in a wire bonding operation, comprising:
   a shank, and
   a head at the end of said shank, said head defining a channel for receiving a lead wire, and a sharp edge at at least one end of the channel, said sharp edge engaging the lead wire and bending it when the head is moved against the lead wire at a location spaced from said electrical circuit device and is then moved inward relative to said device.

10. The lead wire forming device of claim 9, wherein a single channel is provided extending fully across said head.

11. The lead wire forming device of claim 9, wherein a pair of mutually orthogonal intersecting channels are provided that extend fully across said head, with a sharp edge at both ends of each channel.

12. The lead wire forming device of claim 9, wherein said shank is tapered towards and terminates in said head.

13. The lead wire forming device of claim 9, wherein the depth of said channel is less than the thickness of the lead wire.

* * * * *